(12) United States Patent
Ozaki et al.

(10) Patent No.: US 8,457,774 B2
(45) Date of Patent: Jun. 4, 2013

(54) SUBSTRATE PROCESSING APPARATUS, CONTROL METHOD OF THE SUBSTRATE PROCESSING APPARATUS, MANUFACTURING METHOD OF SEMICONDUCTOR DEVICE AND APPARATUS STATE SHIFTING METHOD

(75) Inventors: Yukio Ozaki, Nakaniikawa-gun (JP); Satoru Takahata, Imizu (JP); Ichiro Nunomura, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 223 days.

(21) Appl. No.: 12/897,111

(22) Filed: Oct. 4, 2010

(65) Prior Publication Data
US 2011/0082581 A1    Apr. 7, 2011

(30) Foreign Application Priority Data

Oct. 5, 2009  (JP) ................................. 2009-231320
Jul. 16, 2010  (JP) ................................. 2010-161560

(51) Int. Cl.
*G06F 19/00* (2011.01)
(52) U.S. Cl.
USPC ............................... 700/121; 700/14; 700/19
(58) Field of Classification Search
USPC ........................................................ 700/121
See application file for complete search history.

(56) References Cited

U.S. PATENT DOCUMENTS

| | | |
|---|---|---|
| 2003/0149506 A1 | 8/2003 | Haanstra et al. |
| 2007/0235060 A1 | 10/2007 | Takizawa et al. |
| 2008/0314316 A1* | 12/2008 | Kitabata ....................... 118/712 |

FOREIGN PATENT DOCUMENTS

| | | |
|---|---|---|
| JP | A-2000-216072 | 8/2000 |
| JP | A-2003-036111 | 2/2003 |
| JP | A-2003-037054 | 2/2003 |
| JP | A-2003-282389 | 10/2003 |
| JP | A-2007-266605 | 10/2007 |

OTHER PUBLICATIONS

Oct. 31, 2011 Office Action issued in Japanese Patent Application No. 2010-161560 (with translation).
Aug. 19, 2011 Office Action issued in Korean Application No. 10-2010-0083923 (with partial translation).
Mar. 27, 2012 Office Action issued in Korean Application No. 10-2010-0083923 (with translation).

* cited by examiner

*Primary Examiner* — Carlos Ortiz Rodriguez
(74) *Attorney, Agent, or Firm* — Oliff & Berridge, PLC

(57) ABSTRACT

To perform a maintenance work safely by a maintenance engineer, even if the maintenance work is performed with power of a substrate processing apparatus turned-on. A substrate processing apparatus, comprising: a controller that inhibits a shift from an idling state to a standby state, when a generation of a prescribed event is detected; the controller further comprising: a shift indicating part that controls an apparatus state so as to be shifted from the idling state possible to receive an indication of execution of the recipe, being an apparatus state possible to step into the substrate processing apparatus, to the standby state possible to execute a recipe, being an apparatus state impossible to step into the substrate processing apparatus; and an event detection part that detects a generation of the prescribed event for inhibiting a shift from the idling state to the standby state and notifies the shift indicating part of the prescribed event.

3 Claims, 8 Drawing Sheets

FIG.6

| | State | Definition |
|---|---|---|
| Communication state with group control device | Off line (OFF LINE) | The communication with the group control device is disconnected, or only a command from a touch panel is set in an effective state, or the communication with the group control device is connected, and a command from the group control device is set in an ineffective state, and only a display on the touch panel is effective. |
| | On line (ON LINE) | The communication with the group control device is connected, and the command from the group control device is set in an effective state. |
| Apparatus state of substrate processing apparatus | Initial state (RESET mode) | An initial state immediately after turning-on a power or immediately after resetting an apparatus due to trouble. |
| | Idling state (IDLE mode) | An idling state possible to allow personnel to step into a substrate processing apparatus and possible to receive an indication of execution of a recipe. |
| | Standby state (STANDBY mode) | A standby state impossible to allow the personnel to step into the substrate processing apparatus and possible to execute the recipe. |
| | Running state (RUN mode) | Running state of the recipe. |
| | End state (END mode) | End state of the recipe (normal end/abnormal end) |
| Communication state with substrate transfer system | Local (LOCAL) | The communication with a substrate transfer system is disconnected, and the command from the touch panel is set in an ineffective state. |
| | Remote (REMOTE) | The communication with the substrate transfer system is connected, and the command from the touch panel is set in an effective state. |

SUBSTRATE PROCESSING APPARATUS, CONTROL METHOD OF THE SUBSTRATE PROCESSING APPARATUS, MANUFACTURING METHOD OF SEMICONDUCTOR DEVICE AND APPARATUS STATE SHIFTING METHOD

CROSS-REFERENCE TO RELATED APPLICATION

The present application claims priorities from Japanese Patent Application No. JP2009-231320 filed on Oct. 5, 2009, and Japanese Patent Application No. JP2010-161560 filed on Jul. 16, 2010, the contents of which are hereby incorporated by reference into this application.

BACKGROUND

1. Technical Field

The present invention relates to a substrate processing apparatus that processes substrates, a control method of the substrate processing apparatus, and a manufacturing method of a semiconductor device and an apparatus state shifting method.

2. Description of Related Art

Conventionally, as one of the manufacturing steps of a device such as DRAM and IC, a substrate processing step of processing a substrate has been executed, based on a recipe in which a processing condition and a processing procedure are defined. An operation of each part of the substrate processing apparatus that executes such a step, is controlled by a controller.

Maintenance (maintenance work) of the substrate processing apparatus is performed by maintenance engineer who steps into the substrate processing apparatus for replacing or repairing components or confirmation of an operation of each part and re-adjustment of each part. At this time, in order to shorten the time required for the maintenance work, the maintenance work is sometimes performed with power of the substrate processing apparatus turned-on.

However, since the maintenance work is performed with power of the substrate processing apparatus turned-on, there is a problem that a state shift condition is satisfied unexpectedly against thought of the maintenance engineer during maintenance, and an apparatus state is automatically set in a standby state possible to execute a specified recipe and the specified recipe has been executed.

SUMMARY OF THE INVENTION

An object of the present invention is to provide a substrate processing apparatus capable of perform maintenance work safely by a maintenance engineer even if the maintenance is performed with power of the substrate processing apparatus turned-on, a control method of the substrate processing apparatus, a manufacturing method of a semiconductor device, and an apparatus state shifting method.

According to an aspect of the present invention, a substrate processing apparatus is provided, comprising:

a controller that inhibits a shift from an idling state to a standby state, when a generation of a prescribed event is detected;

the controller further comprising:

a shift indicating part that controls an apparatus state so as to be shifted from the idling state possible to receive an indication of execution of the recipe, being an apparatus state possible to step into the substrate processing apparatus, to the standby state possible to execute a recipe, being an apparatus state impossible to step into the substrate processing apparatus; and an event detection part that detects a generation of the prescribed event for inhibiting a shift from the idling state to the standby state and notifies the shift indicating part of the prescribed event.

According to other aspect of the present invention, a control method of a substrate processing apparatus is provided, comprising the steps of:

shifting an apparatus state to a idling state possible to receive an indication of execution of a specified recipe, being a state possible to step into a substrate processing apparatus, from an initial state immediately after turning-on a power of the substrate processing apparatus;

shifting an apparatus state to a standby state possible to execute the specified recipe, being a state impossible to step into the substrate processing apparatus, from the idling state; and shifting the apparatus state to a running state to execute a specified processing in accordance with a processing condition and a processing procedure defined in the specified recipe, from the standby state, wherein when a prescribed event for inhibiting a shift from the idling state to the standby state is generated in the idling state, the shift from the idling state to the standby state is inhibited, and the specified recipe is not allowed to be executed.

According to further other aspect of the present invention, a manufacturing method of a semiconductor device is provided, comprising the steps of:

shifting an apparatus state to an idling state possible to receive an indication of execution of a specified recipe, being a state possible to step into a substrate processing apparatus, from an initial state immediately after turning-on a power of a substrate processing apparatus;

shifting the apparatus state to a standby state possible to execute the specified recipe, being an apparatus state impossible to step into the substrate processing apparatus, from the idling state, and shifting the apparatus state to a running state to execute a specified processing in accordance with a processing condition and a processing procedure defined in the specified recipe, from the standby state, wherein the specified recipe is executed and a specified processing is applied to substrates in the running state, and when a prescribed event for inhibiting a shift from the idling state to the standby state is generated in the idling state, the shift from the idling state to the standby state is inhibited and the specified recipe is not allowed to be executed.

According to further other aspect of the present invention, an apparatus state shifting method is provided, comprising the steps of:

shifting an apparatus state to an idling state possible to receive an indication of execution of a specified recipe, being a state possible to step into an apparatus, from an initial state immediately after turning-on a power of the apparatus;

shifting the apparatus state to a standby state possible to execute the specified recipe, being an apparatus state impossible to step into the apparatus;

shifting the apparatus state to a running state to execute a specified processing in accordance with a processing condition and a processing procedure defined in the specified recipe, from the standby state; and shifting the apparatus state from the running state to the idling state, when the specified recipe is ended, wherein when a prescribe event for inhibiting a shift from the idling state to the standby state is generated, the shift from the idling state to the standby state is inhibited.

According to the substrate processing apparatus of the present invention, safety during a maintenance work is improved, by automatically not allowing a specified recipe to be executed, even if the maintenance work is performed with a power of the substrate processing apparatus turned-on.

BRIEF DESCRIPTION OF THE DRAWINGS

FIG. 6 is a view exemplifying a communication state between the substrate processing apparatus and a group management device and a state of the substrate processing apparatus, and a definition of the communication state between the substrate processing controller and a substrate transfer system, according to an embodiment of the present invention.

DESCRIPTION OF PREFERRED EMBODIMENT OF THE INVENTION

An Embodiment of the Present Invention

An embodiment of the present invention will be described hereafter.

(1) Structure of a Substrate Processing System

Figure 1:
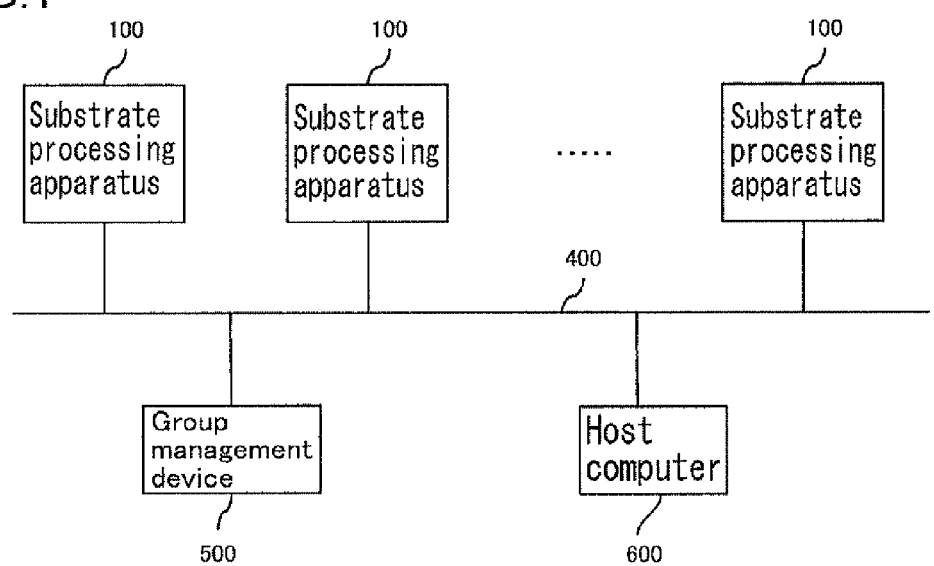
FIG. 1 is a schematic block diagram of a substrate processing system according to an embodiment of the present invention.

First, a structure of a substrate processing system according to an embodiment of the present invention will be described, with reference to FIG. 1. FIG. 1 is a schematic block diagram of the substrate processing system according to an embodiment of the present invention.

As shown in FIG. 1, the substrate processing system according to this embodiment includes: at least one set of a substrate processing apparatus 100; a host computer 600 and a group management device 500 connected to the substrate processing apparatus 100 to enable data exchange to be conducted between them. The substrate processing apparatus 100 executes a processing process based on a recipe in which a processing procedure and a processing condition are defined. The substrate processing apparatus 100, and the group management device 500 and/or the host computer 600 are connected by a network 400 such as a private line (LAN) and a broad-area line (WAN).

(2) Structure of the Substrate Processing Apparatus

Figure 2:
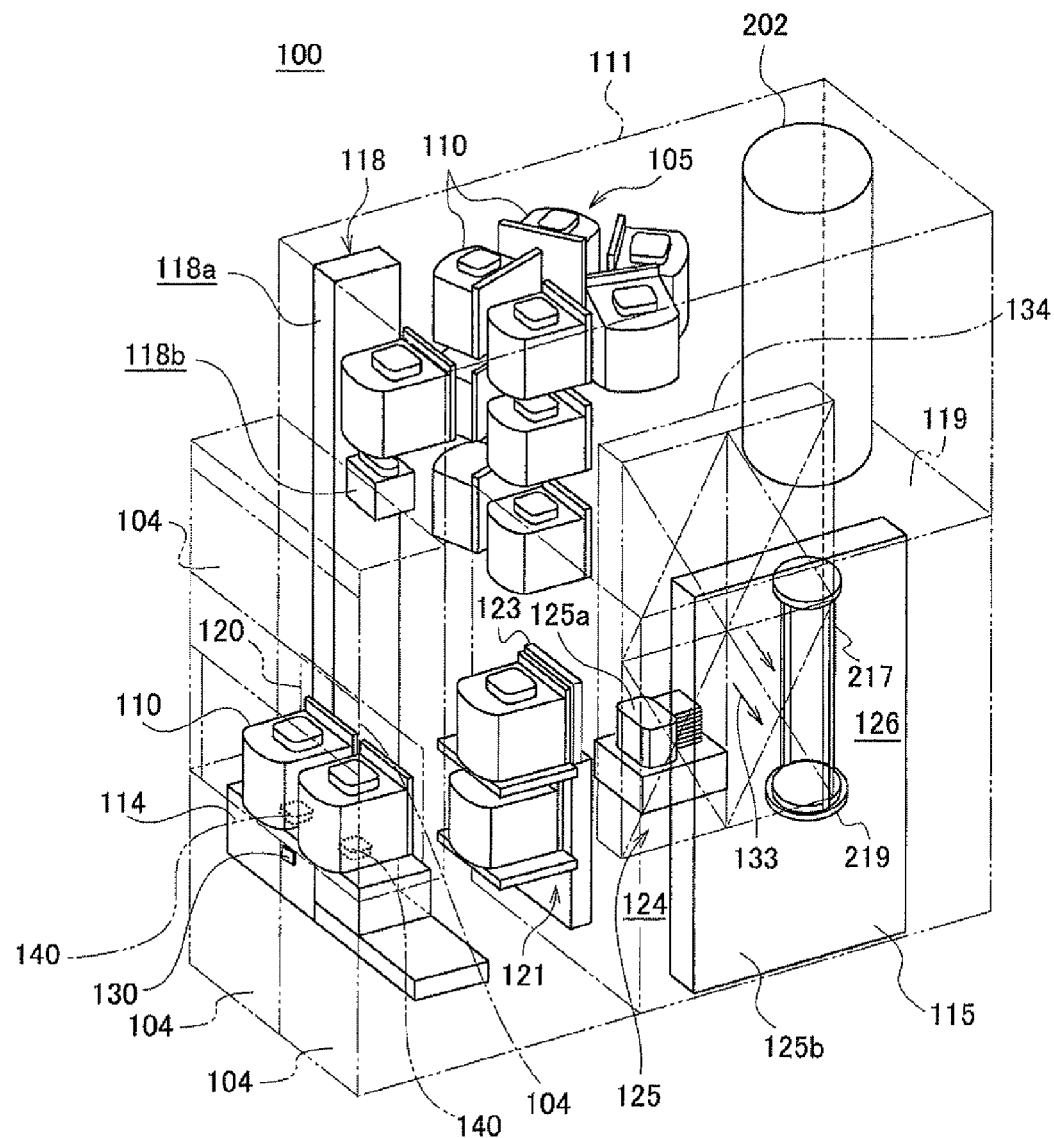
FIG. 2 is a perspective view of a substrate processing apparatus according to an embodiment of the present invention.
Figure 3:
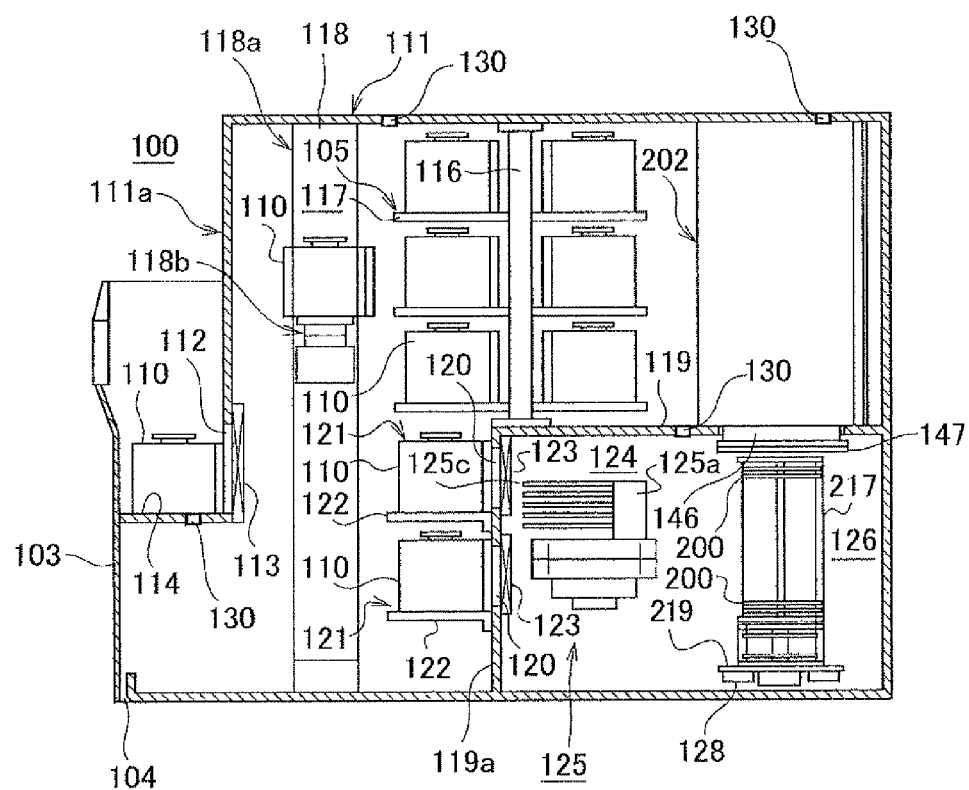
FIG. 3 is a side perspective view of the substrate processing apparatus according to an embodiment of the present invention.

Subsequently, the structure of the substrate processing apparatus 100 according to this embodiment will be described, with reference to FIG. 2 and FIG. 3. FIG. 2 is a perspective view of the substrate processing apparatus according to an embodiment of the present invention. FIG. 3 is a side perspective view of the substrate processing apparatus according to an embodiment of the present invention. Note that the substrate processing apparatus 100 according to this embodiment is constituted as a vertical apparatus that applies oxidation processing, dispersion processing, and CVD processing to a substrate such as a wafer based on a recipe.

As shown in FIG. 2 and FIG. 3, the substrate processing apparatus 100 according to this embodiment includes a casing 111 formed as a pressure-resistant container. A front maintenance port 103, being an opening part to allow maintenance to be performed therefrom, is opened on a front side part of a front wall 111a of the casing 111. A pair of front maintenance doors 104 are provided to the front maintenance port 103, as a step-in mechanism for opening and closing the front maintenance port 103. A pod (substrate container) 110 with wafer (substrate) 200 such as silicon stored therein, is used as a carrier for carrying the wafer 200 to inside/outside of the casing 111.

A pod loading and unloading port (substrate container loading and unloading port) 112 is opened on a front wall 111a of the casing 111, so as to communicate inside/outside of the casing 111. The pod loading and unloading port 112 is opened and closed by a front shutter (open/close mechanism of the substrate container loading and unloading port) 113. A load port (substrate container transfer table) 114 as a placement part is installed on the front side of the pod loading and unloading port 112. A pod 110 is placed and positioned on the load port 114. The pod 110 is carried onto the load port 114 by an in-step carrier device (not shown) such as OHT (Overhead Hoist Transport).

A rotary pod shelf (substrate container placement shelf) 105 is installed in an upper part in approximately a central part in a longitudinal direction of the casing 111. A plurality of pods 110 are stored on the rotary pod shelf 105. The rotary pod shelf 105 stands upright vertically, including a supporting post 116 intermittently rotated in a horizontal surface, and a plurality of shelf plates (substrate container placement tables) 117 radially supported by the supporting post at each position of upper, middle, and lower stages. A plurality of pods 110 are held by the plurality of shelf plates 117 in a state of being placed thereon.

A pod carrier (substrate container carrier) 118 is installed between the load pod 114 and the rotary pod shelf 105 in the casing 111. The pod carrier 118 is constituted of a pod elevator (substrate container elevating mechanism) 118a that can be elevated and descended while holding the pod 110; and a pod carrying mechanism (substrate container carrying mechanism) 118b, being a carrying mechanism. The pod 110 is carried mutually among the load port 114, the rotary pod shelf 105, and a pod opener (substrate container lid member open/close mechanism) 121, by a continuous operation of the pod elevator 118a and the pod carrying mechanism 118b.

A sub-casing 119 is provided in a lower part of the casing 111, so as to extend from approximately the central part in the longitudinal direction, to the rear end of the casing 111. A pair of wafer loading/unloading ports (substrate loading/unloading ports) 120 for carrying the wafer 200 to inside/outside of the sub-casing 119, are provided on a front wall 119a of the sub-casing 119, so as to be arranged side by side in upper and lower two stages. A pod opener 121 is installed in each wafer loading/unloading port 120 at the upper and lower stages.

Each pod opener 121 has a pair of placement tables 122 for placing the pod 110, and a cap attaching and detaching mechanism (lid member attaching and detaching mechanism) 123 for attachment and detachment of a cap (lid member) of the pod 110. The pod opener 121 opens and closes a wafer charging and discharging port of the pod 110, by attaching and detaching the cap of the pod 110 placed on the placement table 122, by the cap attaching and detaching mechanism 123.

A transfer chamber 124 which is fluidly isolated from a space for installing the pod carrier 118 and the rotary pod shelf 105, etc, is formed in the sub-casing 119. A wafer transfer mechanism (substrate transfer mechanism) 125 is installed in a front side area of the transfer chamber 124. The wafer transfer mechanism 125 is constituted of a wafer transfer device (substrate transfer device) 125a capable of horizontally rotating or straightly moving the wafer 200, and a wafer transfer device elevator (substrate transfer device elevating mechanism) 125b for elevating the wafer transfer device 125a. As shown in FIG. 2, the wafer transfer device elevator 125b is installed between right end portion in a front region of the transfer chamber 124 of the sub-casing 119, and a right side end portion of the casing 111. The wafer transfer device 125a includes a tweezer (substrate holding body) 125c, being a placement part of the wafer 200. By continuous operation of the wafer transfer device elevator 125b and the wafer transfer device 125a, the wafer 200 can be charged and discharged into/from a boat (substrate holding tool) 217.

An idling part 126 for containing the boat 217 and making it in an idling mode, is formed in a backside area of the transfer chamber 124. A processing furnace 202 is provided in an upper part of the idling part 126. A lower end portion 146 of the processing furnace 202 is opened and closed by a furnace port shutter (furnace port open/close mechanism) 147.

As shown in FIG. 2, a boat elevator (substrate holding tool elevating mechanism) 115 is installed between a right end portion of the idling part 126 of the sub-casing 119, and a right side end portion of the casing 111. An arm 128 as a connection tool is connected to an elevation table of the boat elevator 115. A seal cap 219 as a lid member is horizontally fitted to the arm 128. The boat 217 is vertically supported by the seal cap 219, so that the lower end portion 146 of the processing furnace 202 can be closed.

A substrate transfer system according to this embodiment is mainly constituted by the rotary pod shelf 105, boat elevator 115, pod carrier (substrate container carrier) 118, wafer transfer mechanism (substrate transfer mechanism) 125, boat 217, and a rotation mechanism 254 as will be described later. These rotary pod shelf 105, boat elevator 115, pod carrier (substrate container carrier) 118, wafer transfer mechanism (substrate transfer mechanism) 125, boat 217 and rotation mechanism 254, are electrically connected to a transfer controller 11, being a sub-controller as will be described later.

The boat 217 includes a plurality of holding members. The boat 217 holds a plurality of (for example about 50 to 125) wafers 200, in a state of being vertically arranged with their centers aligned respectively in a horizontal posture.

As shown in FIG. 2, a clean unit 134 is installed on the left side end portion, being an opposite side to the side of the wafer transfer device elevator 125b and the side of the boat elevator 115. The clean unit 134 is constituted of a supply fan and a dust-proof filter, to thereby supply cleaned atmosphere or clean air 133, being an inert gas. A notch alignment device (not shown), being a substrate alignment device, for aligning positions in a circumference direction of the wafer, is installed between the wafer transfer device 125a and the clean unit 134.

The clean air 133 blown out from the clean unit 134, is circulated through a circumference of the notch alignment device not shown, wafer transfer device 125a, and boat 217 in the idling part 126, and then is sucked by a duct not shown and is exhausted to outside of the casing 111, or is circulated to a primary side (supply side), being a suction side of the clean unit 134 and is blown out again into the transfer chamber 124 by the clean unit 134.

Note that a plurality of device covers not shown are mounted on an outer periphery of the casing 111 and the sub-casing 119, as a step-in mechanism into the substrate processing apparatus 100. These device covers are dismounted during maintenance work, so that maintenance engineer can step into the substrate processing apparatus 100. A door switch 130 as a step-in sensor is provided to the end portion of the casing 111 and the sub-casing 119, facing the device covers. Also, the door switch 130 as the step-in sensor is provided to the end portion of the casing 111 facing the front maintenance door 104. Further, a substrate detection sensor 140 for detecting the placement of the pod 110 is provided on the load port 114. These door switch 130 and switches and sensors such as substrate detection sensor 140, are electrically connected to a substrate processing apparatus controller 240 as will be described later, via an input/output controller 15 as will be described later.

(3) Operation of the Substrate Processing Apparatus

Next, an operation of the substrate processing apparatus 100 according to this embodiment, will be described, with reference to FIG. 2 and FIG. 3.

As shown in FIG. 2 and FIG. 3, when the pod 110 is supplied to the load port 114 by an in-step carrier device (not shown), the pod 110 is detected by the substrate detection sensor 140, and the pod loading/unloading port 112 is opened by the front shutter 113. Then, the pod 110 on the load port 114 is loaded into the casing 111 from the pod loading/unloading port 112 by the pod carrier 118.

The pod 110 loaded into the casing 111 is automatically carried to the shelf plate 117 of the rotary pod shelf 105 by the pod carrier 118, and is temporarily stored therein. Thereafter, the pod 110 is transferred to the placement table 122 of one of the pod openers 121 from the shelf plate 117. Note that the pod 110 loaded into the casing 111 may also be directly transferred to the placement table 122 of the pod opener 121 by the pod carrier 118. At this time, the wafer loading/unloading port 120 of the pod opener 121 is closed by the cap attaching and detaching mechanism 123, and the clean air 133 is circulated through the transfer chamber 124 and the transfer chamber 124 is filled with the clean air 133. For example, by filling the transfer chamber 124 with nitrogen gas as the clean air 133, oxygen concentration in the transfer chamber 124 is set to be for example 20 ppm or less, so as to be further lower than the oxygen concentration in the casing 111 which is set as an atmospheric environment.

An opening side end face of the pod 110 placed on the placement table 122 is pressed to an opening edge portion of the wafer loading/unloading port 120 on the front wall 119a of the sub-casing 119, and its cap is detached by the cap attaching and detaching mechanism 123, to thereby open the wafer charging and discharging port. Thereafter, the wafer 200 is picked up from the pod 110 through the wafer charging and discharging port by the tweezer 125c of the wafer transfer device 125a, and after an azimuth direction is aligned by the notch aligning device, the wafer 200 is loaded into the idling part 126 located rearward of the transfer chamber 124, and is charged into the boat 217. After the wafer 200 is charged into the boat 217, the wafer transfer device 125a with the wafer 200 charged into the boat 217, returns to the pod 110, and the next wafer 200 is charged into the boat 217.

During a charging work of the wafer 200 into the boat 217 by the wafer transfer mechanism 125 in one of the upper stage and the lower stage pod openers 121, another pod 110 is carried and transferred to the placement table 122 of the pod opener 212 from the rotary pod shelf 105 by the pod carrier 118, thus carrying out simultaneous proceeding of an opening work of the pod 110 by the pod opener 121.

When previously designated sheets of wafers 200 are charged into the boat 217, the lower end portion 146 of the processing furnace 202 closed by the furnace port shutter 147 is opened by the furnace port shutter 147. Subsequently, the boat 217 holding a group of wafers 200 is loaded into the processing furnace 202 by elevating the seal cap 219 by the boat elevator 115.

After loading, an arbitrary processing is applied to the wafer 200 in the processing furnace 202. After processing, the boat 217 with the wafer 200 after processing stored therein, is unloaded from the processing chamber 201 in approximately the same procedure as the aforementioned procedure excluding the aligning step of the wafers by the notch aligning device 135, and the pod 110 with the wafer 200 after processing stored therein, is unloaded to the outside of the casing 111.

(4) Structure of the Processing Furnace

Figure 4:
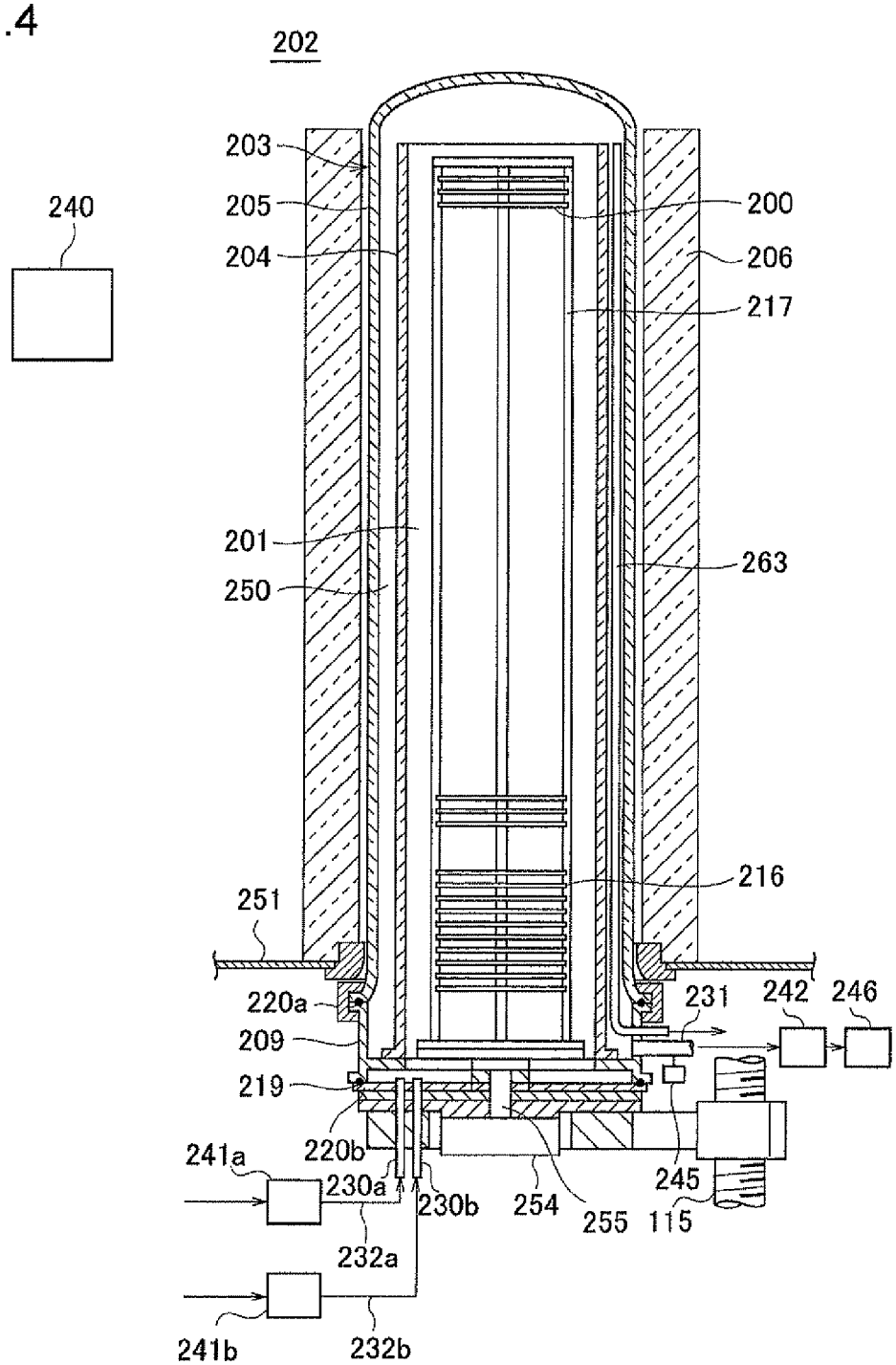
FIG. 4 is a vertical cross sectional view of a processing furnace of the substrate processing apparatus according to an embodiment of the present invention.

Subsequently, the structure of the processing furnace 202 according to this embodiment will be described, with reference to FIG. 4. FIG. 4 is a vertical cross sectional view of the processing furnace 202 of the substrate processing apparatus 100 according to an embodiment of the present invention.

As shown in FIG. 4, the processing furnace 202 includes a process tube 203 as a reaction tube. The process tube 203 includes an inner tube 204 as an internal reaction tube, and an outer tube 205 as an external reaction tube provided outside of the inner tube 204. The inner tube 204 is made of, for example, a heat resistant material such as quartz ($SiO_2$) or silicon carbide (SiC). The inner tube 204 is formed into a cylindrical shape, with an upper end and a lower end opened. The processing chamber 201 for processing the wafer 200 as the substrate is formed in a cylindrical hollow part of the inner tube 204. The processing chamber 201 is formed so as to contain the boat 217 therein as will be described later. The outer tube 205 is provided concentrically with the inner tube 204. The outer tube 205 has an inner diameter larger than an outer diameter of the inner tube 204, and is formed into a cylindrical shape with the upper end closed and the lower end opened. The outer tube 205 is made of a heat resistant material such as quartz or silicon carbide.

A heater 206 as a heating mechanism is provided to outside of the process tube 203, so as to surround a side wall face of the process tube 203. The heater 206 is formed into a cylindrical shape. The heater 206 is vertically installed on a heater base 251 as a holding plate, so as to be supported by the heater base 251.

A manifold 209 is disposed in a lower part of the outer tube 205 so as to be concentric to the outer tube 205. The manifold 209 is made of, for example, stainless, etc. The manifold 209 is formed into a cylindrical shape with an upper end and a lower end opened. The manifold 209 is engaged with a lower end portion of the inner tube 204 and a lower end portion of the outer tube 205 respectively. The manifold 209 is provided so as to support the lower end portion of the inner tube 204 and the lower end portion of the outer tube 205. Note that an O-ring 220a as a seal member is provided between the manifold 209 and the outer tube 205. The manifold 209 is supported by the heater base 251, to thereby vertically install the process tube 203. A reaction vessel is formed by the process tube 203 and the manifold 209.

A processing gas nozzle 230a and a purge gas nozzle 230b as gas introduction parts are connected to the seal cap 219 as will be described later, so as to communicate with inside of the processing chamber 201. A processing gas supply tube 232a is connected to the processing gas nozzle 230a. A processing gas supply source, etc, not shown is connected to an upstream side of the processing gas supply tube 232a (opposite side to a connection side with the processing gas nozzle 230a), via a MFC (mass flow controller) 241a, being a gas flow rate controller. Further, a purge gas supply tube 232b is connected to the purge gas nozzle 230b. A purge gas supply source, etc, not shown is connected to an upstream side of the purge gas supply tube 232b (opposite side to a connection side with the purge gas nozzle 230b), via a MFC (mass flow controller) 241b, being a gas flow rate controller.

A processing gas supply system according to this embodiment is mainly constituted by the processing gas supply source (not shown), MFC241a, processing gas supply tube 232a and processing gas nozzle 230a. A purge gas supply system according to this embodiment is mainly constituted by the purge gas supply source (not shown), MFC241b, purge gas supply tube 232b and purge gas nozzle 230b. A gas supply system according to this embodiment is mainly constituted by the processing gas supply system and the purge gas supply system. A gas supply controller 14 as a sub-controller as will be described later, is electrically connected to the MFC 241a and the MFC 241b.

An exhaust tube 231 for exhausting an atmosphere in the processing chamber 201 is provided to the manifold 209. The exhaust tube 231 is disposed in a lower end portion of a cylindrical space 250 formed by a gap between the inner tube 204 and the outer tube 205. The exhaust tube 231 is communicated with the cylindrical space 250. A pressure sensor 245 as a pressure detector, for example a pressure adjuster 242 formed as APC (Auto Pressure Controller), and a vacuum exhaust device 246 such as a vacuum pump, are connected to a downstream side (opposite side to the connection side to the manifold 209) of the exhaust tube 231, sequentially from the upstream side. A gas exhaust mechanism according to this embodiment is mainly constituted by the exhaust tube 231, pressure sensor 245, pressure adjuster 242, and vacuum exhaust device 246. A pressure controller 13, being a sub-controller as will be described later, is electrically connected to the pressure adjuster 242 and the pressure sensor 245.

The seal cap 219 as a furnace port lid member is capable of air-tightly closing a lower end opening of the manifold 209, and the seal cap 219 is provided in a lower part of the manifold 209. The seal cap 219 is abutted on the lower end of the manifold 209 from vertically lower side. The seal cap 219 is made of metal such as stainless. The seal cap 219 is formed into a disc shape. An O-ring 220b as a seal member abutted on the lower end of the manifold 209 is provided on an upper face of the seal cap 219.

A rotation mechanism 254 for rotating the boat is installed on the opposite side to the processing chamber 201 in the vicinity of a central part of the seal cap 219. The boat 217 is supported from below by a rotation shaft 255 of the rotation mechanism 254 in such a manner as passing through the seal cap 219. By means of the rotation mechanism 254, the wafer 200 can be rotated by rotation of the boat 217.

The seal cap 219 is vertically elevated by the boat elevator 115, being a substrate holding tool elevating mechanism, which is vertically installed to outside of the process tube 203. By elevating the seal cap 219, the boat 217 can be carried into/outside the processing chamber 201. The transfer controller 11, being the sub-controller as will be described later, is electrically connected to the rotation mechanism 254 and the boat elevator 115.

As described above, the boat 217 as the substrate holding tool is formed so that a plurality of wafers 200 are held in multiple stages, with centers thereof mutually aligned in a horizontal posture. The boat 217 is made of the heat resistant material such as quartz and silicon carbide. A plurality of heat insulating plates 216 as heat insulating members are arranged in a lower part of the boat 217, in multiple stages in a horizontal posture. The heat insulating plate 216 is formed into a disc shape. The heat insulating plate 216 is made of the heat insulating material such as quartz and silicon carbide. Heat from the heater 206 is hardly transmitted to the side of the manifold 209 by the heat insulating plate 216.

A temperature sensor 263 as a temperature detector is disposed in the process tube 203. A heating mechanism according to this embodiment is mainly constituted by the heater 206 and the temperature sensor 263. A temperature controller 12, being a sub-controller as will be describe later, is electrically connected to these heater 206 and temperature sensor 263.

A substrate processing system according to this embodiment is constituted mainly by the processing furnace 202, heating mechanism, gas supply system, gas exhaust mechanism, seal cap 219, rotation mechanism 254, boat elevator 115, boat 217, and each kind of sub-controller and sensor.

(5) Operation of the Processing Furnace

Subsequently, as a step of the manufacturing steps of the semiconductor device, a method of forming a thin film on the wafer 200 by a CVD method using the processing furnace 202 according to the aforementioned structure, will be described, with reference to FIG. 4. Note that in the description hereunder, the operation of each part constituting the substrate processing apparatus 100 is controlled by the substrate processing apparatus controller 240. In this case, the substrate processing apparatus controller 240 selects an optimal substrate processing recipe (process recipe) as a recipe for forming the thin film on the wafer 200, and executes this recipe.

When a plurality of wafers 200 are charged into the boat 217, as shown in FIG. 4, the boat 217 holding the plurality of wafers 200, is elevated by the boat elevator 115 and is loaded into the processing chamber 201 (boat loading). In this state, the lower end of the manifold 209 is set in a state of being sealed via the O-ring 220b.

Inside of the processing chamber 201 is vacuum-exhausted by the vacuum exhaust device 246, so as to be a desired pressure (degree of vacuum). At this time, an opening degree of a valve of the pressure adjuster 242 is feedback-controlled based on a pressure value measured by the pressure sensor 245. Further, the inside of the processing chamber 201 is heated by the heater 206 so as to be a desired temperature. At this time, energization amount to the heater 206 is controlled based on a temperature value detected by the temperature sensor 263. Subsequently, the boat 217 and the wafer 200 are rotated by the rotation mechanism 254.

Subsequently, the processing gas supplied from a processing gas supply source and controlled to be a desired flow rate, is circulated through the gas supply tube 232a and is introduced into the processing chamber 201 from the nozzle 230a.

The introduced processing gas drifts upward through the processing chamber 201, and flows into the cylindrical space 250 from an upper end opening of the inner tube 204, and is exhausted from the exhaust tube 231. The gas is brought into contact with a surface of the wafer 200 when passing through the processing chamber 201, and at this time, a thin film is deposited on the surface of the wafer 200 by thermal CVD reaction.

After elapse of a previously set processing time, the purge gas supplied from the purge gas supply source and controlled to be a desired flow rate by the MFC241b, is supplied into the processing chamber 201, so that the inside of the processing chamber 201 is replaced with inert gas, and the pressure inside of the processing chamber 201 is returned to a normal pressure.

Thereafter, the seal cap 219 is descended by the boat elevator 115, then the lower end of the manifold 209 is opened, and the boat 217 holding an already processed wafer 200 is unloaded from the lower end of the manifold 209 to the outside of the process tube 203 (boat unloading). Thereafter, the already processed wafer 200 is taken out from the boat 217 and is stored in the pod 110 (wafer discharge).

Thus, the substrate processing recipe (process recipe) for processing substrates such as wafers 200 is defined to execute at least a loading (boat loading) step; a processing step of applying processing to the substrates in accordance with the processing condition and the processing procedure, and an unloading (boat unloading) step. Further, as shown in this embodiment, this recipe is sometimes defined to execute wafer charge and wafer discharge.

(6) Structure of the Substrate Processing Apparatus Controller

Subsequently, a block diagram of the substrate processing apparatus controller 240 for controlling the operation of each part constituting the processing furnace 202 and its periphery, will be described with reference to FIG. 5 to FIG. 8.

Figure 5:
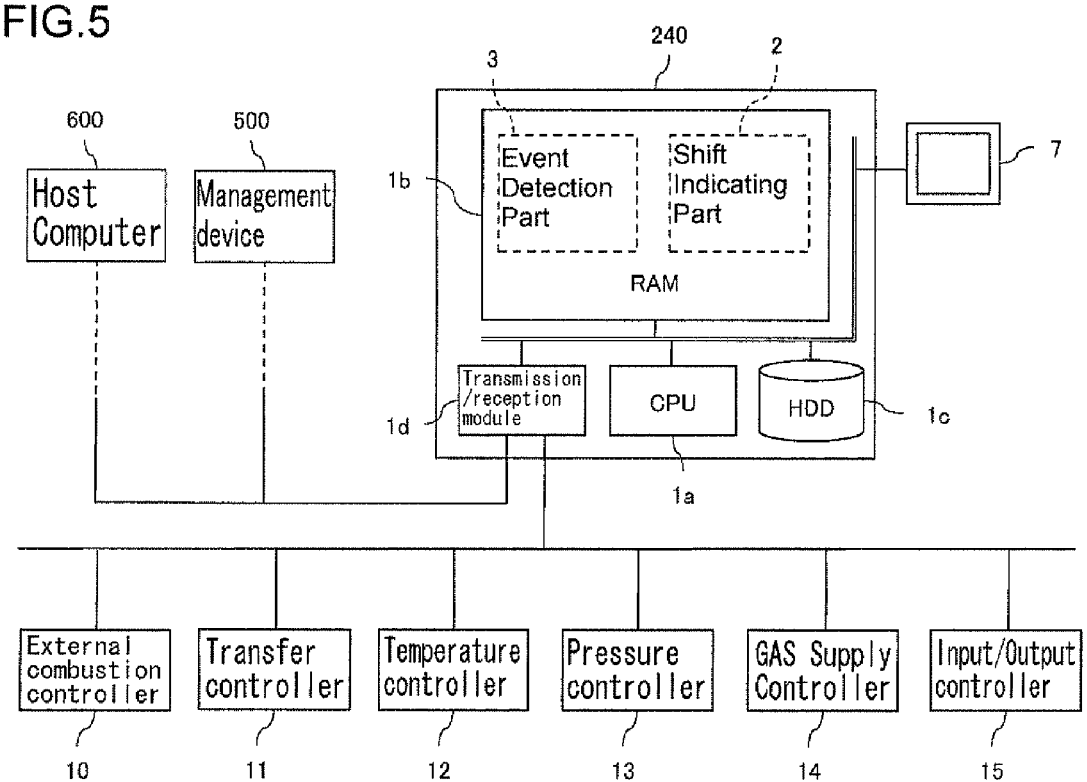
FIG. 5 is a block diagram of a substrate processing controller and its periphery provided to the substrate processing apparatus according to an embodiment of the present invention.
Figure 7:
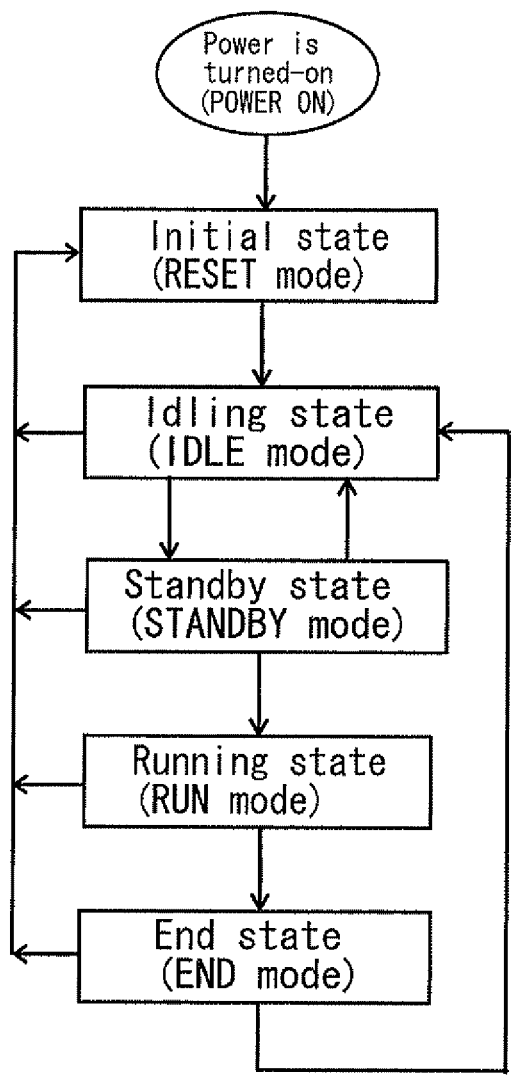
FIG. 7 is a view explaining a shift of a state of the substrate processing apparatus according to an embodiment of the present invention.
Figure 8:
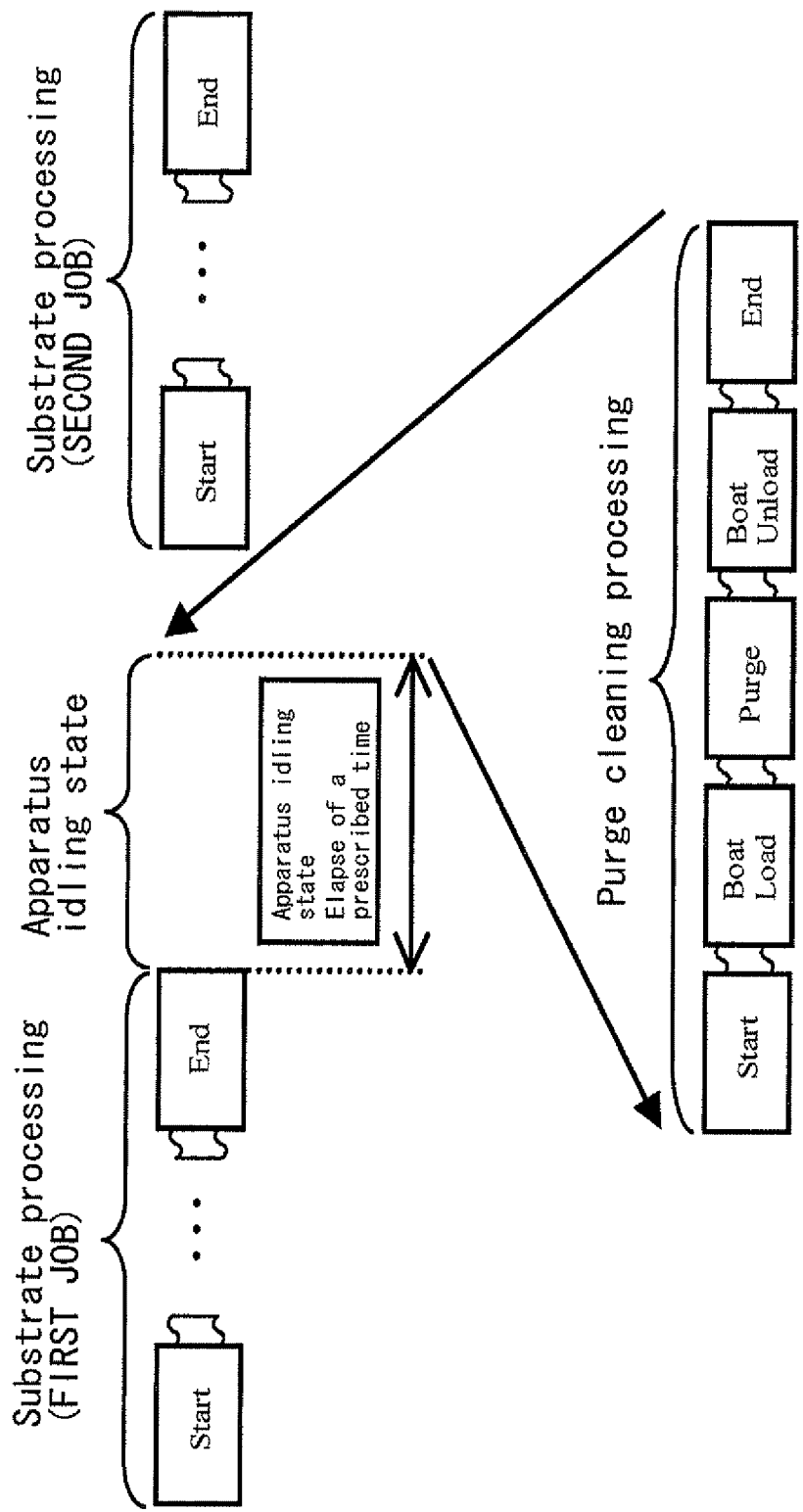
FIG. 8 is a flowchart exemplifying substrate processing and purge cleaning processing according to an embodiment of the present invention.

FIG. 5 is the block diagram of the substrate processing controller provided to the substrate processing apparatus and its periphery according to an embodiment of the present invention. FIG. 6 is a view exemplifying a definition of a communication state between the substrate processing apparatus and the group management device, a state of the substrate processing apparatus, and a communication state between the substrate processing controller and a substrate transfer system. FIG. 7 is a view explaining the shift of a state of the substrate processing apparatus 100 according to an embodiment of the present invention. FIG. 8 is a flowchart exemplifying substrate processing and purge cleaning processing according to an embodiment of the present invention.

(Substrate Processing Controller)

The substrate processing apparatus controller 240 is constituted as a computer including: a CPU (Central Processing Unit) 1a, being a main control part, a memory (RAM) 1b, being a temporary storage part, a hard disc (HDD) 1c, being a fixed storage device (storage part), a transmission/reception module 1d, being a communication control part, and a clock function (not shown). The hard disc 1c stores a shift indicating program file, an event detection program file, a recipe file such as a substrate processing recipe as a process recipe, and a purge cleaning processing recipe as a maintenance recipe, and each kind of screen file and each kind of icon file, etc, (any one of them is not shown). Further, a shift indicating part 2 and an event detection part 3 are realized on a memory 1b, when a shift indicating program and an event detection program are executed respectively.

The substrate processing recipe is a recipe in which a processing condition and a processing procedure, etc, for processing the wafer 200, are defined. As described above, the substrate processing recipe (process recipe) is defined to execute at least the loading (boat loading) step, the step of applying processing to the substrates in accordance with the processing condition and the processing procedure, and the unloading (boat unloading) step, and further is defined to execute the wafer charge and the wafer discharge in some cases. Further, the purge cleaning processing recipe is a recipe in which the processing condition and the processing procedure, etc, are defined for purge-cleaning the inside of the processing chamber 201 by supplying the purge gas into the processing chamber 201. Note that the purge cleaning processing recipe is sometimes defined to execute the loading step and the unloading step of the boat 217 and further execute the wafer charge and wafer discharge, similarly to the process recipe. In the recipe file, set values (control values) transmitted to sub-controllers such as external combustion controller 10, transfer controller 11, temperature controller 12, pressure controller 13, and gas supply controller 14, and a transmission timing, etc, are set, for every step of the substrate processing and the purge cleaning processing.

A touch panel 7 as an operation part is connected to the substrate processing apparatus controller 240. The touch panel 7 displays an operation screen for receiving an input of an operation command to a substrate transfer system and a substrate processing system, and the substrate processing apparatus controller 240 notifies the input to the event detection part 3 as will be described later when the input of the operation command is entered. The operation screen includes each kind of display column and operation button for confirming a state of the substrate transfer system and the substrate processing system, and inputting an operation command into the substrate transfer system and the substrate processing system. Note that the operation part is not limited to the touch panel 7, and may be constituted by a monitor and a keyboard like a personal computer.

(Connection Between the Substrate Processing Controller and the Group Management Device)

The transmission/reception module 1d of the substrate processing apparatus controller 240, is connected to a host computer 600 and a group management device 500 such as a monitor server, via a network 400.

Note that as shown in an upper stage of FIG. 6, there are two communication states such as OFFLINE and ON LINE, as the communication state between the substrate processing apparatus 100 (the transmission/reception module 1d of the substrate processing apparatus controller 240) and the group management device 500. Further, although not shown, there are also two communication states with the host computer 600, such as OFF LINE and ON LINE similarly to the group management device 500.

The OFF LINE includes the following two states. First state is a state that the substrate processing apparatus 100 and the group management device 500 are disconnected, then the operation of the substrate processing apparatus 100 by input of a command from the group management device 500 is ineffective, and the operation of the substrate processing apparatus 100 by input of a command from the touch panel 7 as will be described later is effective. Second state is a state that although the substrate processing apparatus 100 and the group management device 500 are connected, the operation of the substrate processing apparatus 100 by input of a command from the group management device 500 is ineffective, and the operation of the substrate processing apparatus 100 by input of the command from the touch panel 7 as will be described later is effective.

Further, the ON LINE is a state that the substrate processing apparatus 100 and the group management device 500 are connected and the operation of the substrate processing apparatus 100 is effective by input of the command from the group management device 500.

The transmission/reception module 1d controls the communication with the group management device 500, and notifies the event detection part 3 of the OFF LINE communication state, when the communication state with the group management device 500 is OFF LINE.

(Connection Between the Substrate Processing Controller and the Sub-Controller)

The external combustion controller 10, transfer controller 11, temperature controller 12, pressure controller 13, gas supply controller 14, and input/output controller 15, being sub-controllers, respectively connect to the transmission/reception module 1d of the substrate processing apparatus controller 240.

The external combustion controller 10 controls a combustion operation by an external combustion device (not shown) of the processing furnace 202. The external combustion controller 10 notifies the event detection part 3 as will be described later, of values of sensors, when the sensors built-in the external combustion device (not shown) show a prescribed value or an abnormal value, etc, respectively.

The transfer controller 11 controls each transfer operation of the rotary pod shelf 105, boat elevator 115, pod carrier (substrate container carrier) 118, wafer transfer mechanism (substrate transfer mechanism) 125, boat 217, and rotation mechanism 254 which constitute the substrate transfer system. Further, although not shown, sensors are built-in the rotary pod shelf 105, boat elevator 115, pod carrier (substrate container carrier) 118, wafer transfer mechanism (substrate transfer mechanism) 125, boat 217, and rotation mechanism 254, respectively. When the sensors show a prescribed value or an abnormal value, etc, respectively, the transfer controller 11 notifies the event detection part 3 as will be described later of values of the sensors.

Note that there are two states in the communication state between the substrate processing apparatus controller 240 (the transmission/reception module 1d of the substrate processing apparatus controller 240) and the transfer controller 11, such as LOCAL and REMOTE as shown in a lower stage of FIG. 6. The LOCAL is a state that the substrate processing apparatus controller 240 and the substrate transfer system are disconnected and the operation of the substrate transfer system by input of the command from the substrate processing apparatus controller 240 is ineffective, and the operation of the substrate transfer system by input of the command from the touch panel 7 is ineffective. The REMOTE is a state that the substrate processing apparatus controller 240 and the substrate transfer system are connected, and the operation of the substrate transfer system by input of the command from the substrate processing apparatus controller 240 is effective.

The temperature controller 12 adjusts the temperature of the processing furnace 202 by controlling the temperature of the heater 206 of the processing furnace 202, and when the temperature sensor 263 shows a prescribed value and abnormal value, the temperature controller 12 notifies the event detection part 3 as will be described later of these values.

The pressure controller 13 controls the pressure adjuster 242 so that the pressure in the processing chamber 201 is a desired pressure at a desired timing, based on a pressure value detected by the pressure sensor 245, and when the pressure sensor 245 shows the desired value and abnormal value, etc, the pressure controller 13 notifies the event detection part 3 of these values.

The gas supply controller 14 controls supply/stop of the gas from the purge gas supply tube 232a and the purge gas supply tube 232b, by opening and closing a gas valve (not shown). Further, the gas supply controller 14 controls MFCs 241a and 241b, so that the flow rate of the gas supplied into the processing chamber 201 is a desired flow rate at a desired timing. When the sensors (not shown) provided in the MFCs 241a, 241b show a prescribed value and an abnormal value, etc, the gas supply controller 14 notifies the event detection part 3 as will be described later, of these values.

The input/output controller 15 turns-on/off switches and sensors such as a door switch 130 and a substrate detection sensor 140, to thereby detect open/close of the casing 111, sub-casing 119, front maintenance door 104, and detects placement of the pod 110 on the load port 114. The input/output controller 15 detects a prescribed event or detects an event of generation of abnormality from a detection result of the switches and sensors, and notifies the event detection part 3 of the events.

(Event Detection Part)

An event detection program file is read from the hard disc 1c to the memory 1b and is executed by the CPU1a, to thereby realize the event detection part 3 as will be described later on the substrate processing apparatus controller 240.

The event detection part 3 detects the event of generation of various events and notifies the shift indicating part 2 as will be described later of the event. Specifically, when a prescribed event is detected from the external combustion controller 10, transfer controller 11, temperature controller 12, pressure controller 13, gas supply controller 14, input/output controller 15, touch panel 7, and transmission/reception module 1d, the event detection part 3 notifies the shift indicating part 2 of the event.

For example, when the event detection part 3 receives from the external combustion controller 10, a notification regarding the prescribed value and the abnormal value, etc, shown by the sensors built-in the external combustion device (not shown), the shift indicating part 2 is notified of these values.

Also, for example, when the event detection part 3 receives from transfer controller 11, a notification regarding the prescribed value and the abnormal value, etc, shown by the sensors built-in the rotary pod shelf 105, boat elevator 115, pod carrier (substrate container carrier) 118, wafer transfer mechanism (substrate transfer mechanism9 125, boat 217, and rotation mechanism 254, the event detection part 3 notifies the shift indicating part 2 of these values.

Also for example, when the event detection part 3 receives from the temperature controller 12 and the pressure controller 13, the notification regarding a prescribed value and an abnormal value shown by the temperature sensor 263 and the pressure sensor 245, the event detection part 3 notifies the shift indicating part 2 of these values.

Also, for example, when the event detection part 3 receives from the gas supply controller 14 the notification regarding a prescribed value and an abnormal value shown by a gas valve (not shown) and the sensors (not shown) provided in MFCs 241a and 241b, the event detection part 3 notifies the shift indicating part 2 of these values.

Also for example, when the event detection part 3 receives from the input/output controller 15, the notification regarding open/close of the casing 111, sub-casing 119, front maintenance door 104, and the notification regarding the placement of the pod 110 on the load port 114, namely, a detection result from the switches and sensors such as door switch 130 and substrate detection sensor 140, the event detection part 3 notifies the shift indicating part 2 of these messages including the notification or the detection result.

Also, for example, when the event detection part 3 receives from the transmission/reception module 1d, the notification regarding the communication state which is OFF LINE with respect to the sub-controllers (external controller 10, transfer controller 11, temperature controller 12, pressure controller 13, gas supply controller 14) and the input/output controller 15, the event detection 3 notifies the shift indicating part 2 of this message.

Also, for example, when the event detection part 3 receives from the transmission/reception module 1d, the notification regarding the communication state which is OFF LINE with respect to the group management device 500, the event detection 3 notifies the shift indicating part 2 of this message.

Note that the communication between the shift indicating part 2 and the event detection part 3 is performed by using a shared memory area which is dynamically ensured in the memory 1b when the shift indicating program and the event detection program are started. For example, when a message is written into the shared memory area, etc, by either one of the shift indicating part 2 and the event detection part 3, the other one reads the message written into the shared memory, etc, at a prescribed timing.

(Shift Indicating Part)

The shift indicating program file is read from the hard disc 1c to the memory 1b and is executed by the CPU1a, to thereby realize the shift indicating part 2 on the substrate processing apparatus controller 240.

As shown in FIG. 7, the shift indicating part 2 controls an apparatus state (apparatus mode) of the substrate processing apparatus 100 so as to be shifted to five states, such as the initial state (RESET mode), idling state (IDLE mode), standby state (STANDBY mode), running state (RUN mode), and end state (END mode).

As shown in FIG. 7, when power of the substrate processing apparatus 100 is turned on (POWER On), the shift indicating part 2 sets a state of each part of the substrate processing apparatus 100 in the initial state (RESET mode).

The initial state (RESET mode) is an initial state (POWER On) immediately after turning-on the power of the substrate processing apparatus 100, or an initial state immediately after resetting the substrate processing apparatus due to generation of a trouble that occurs to the substrate processing apparatus 100. Specifically, the rotary pod shelf 105, boat elevator 115, pod carrier (substrate container carrier) 118, wafer transfer mechanism (substrate transfer mechanism) 125, boat 217, and rotation mechanism 254 constituting the substrate transfer system, are moved to original points and are set in a stop state. Further, the substrate processing system, such as gas exhaust mechanism, heating mechanism, and gas supply system are respectively set in a stop state. Further, an initial screen is displayed in the touch panel 7, and the transmission/reception module 1d is set in a communicable state with the group management device 500 and the host computer 600.

When the state of each part of the substrate processing apparatus 100 is set in the initial state (RESET mode), the shift indicating part 2 controls the apparatus state of the substrate processing apparatus 100 so as to be shifted to a state as an idling state (IDLE mode) possible to allow the person to step into the substrate processing apparatus 100, and possible to receive the indication of execution of the substrate processing recipe or the purge cleaning processing recipe.

The idling state (IDLE mode) is an apparatus state possible to allow the person to step into the substrate processing apparatus 100, and is a state possible to receive the indication of execution of the recipe. The idling state (IDLE mode) is a state possible to allow the person to step into the substrate processing apparatus 100 such as opening the front maintenance door 104 or dismounting a device cover (not shown) and perform maintenance work. Specifically, the idling state includes a state in which power supply to the substrate processing system such as a heater 206 of the heating mechanism is stopped (or power is supplied so that the heater 206 is set at a normal temperature (default)), or a state in which drive of the wafer transfer mechanism (substrate transfer mechanism) 125 constituting the substrate transfer system is stopped (fixed) at the original position and automatically set in a no-motion state (or the wafer transfer mechanism (substrate transfer mechanism) 125 is safely activated immediately manually by maintenance engineer), and a state in which the maintenance engineer can safely work in the substrate processing apparatus 100.

When the apparatus state of the substrate processing apparatus 100 is set in the idling state (IDLE mode), the shift indicating part 2 sets the apparatus state in a "idling state" for waiting for the generation of a prescribed event, and starts measurement of an elapsed time from completion of the shift to the idling state (IDLE mode) by utilizing the clock function of the substrate processing apparatus controller 240.

Then, when the state is set in the "idling state", the shift indicating part 2 is notified of the generation of a prescribed event when it is detected by the event detection part 3. Then, the shift indicating part 2 controls the state of the substrate processing apparatus 100 so as to be inhibited from shifting to the standby state (STANDBY mode) from the idling state (IDLE mode) and stay in the idle mode (IDLE mode).

Here, the prescribed events correspond to (a) the casing 111, the sub-casing 119, and the front maintenance door 104, etc, are opened (for example, there is a notification from the door switch 130 regarding opening of them), (b) the substrate processing apparatus 100 and the group management device 500 are disconnected, then the operation of the substrate processing apparatus 100 by input of a command from the group management device 500 is ineffective, and the operation of the substrate processing apparatus 100 by input of the command from the touch panel 7 is effective, (c) the substrate processing apparatus controller 240 and the substrate transfer system are disconnected, then the operation of the substrate transfer system by input of the command from the substrate processing apparatus controller 240 is ineffective, and the operation of the substrate transfer system by input of the command from the touch panel 7 is ineffective (to be set in the aforementioned LOCAL state). Such events are also called shift inhibited events hereafter.

Further, when the shift indicating part 2 controls the apparatus state to be set in the aforementioned "idling state", the substrate processing apparatus 100 is set in the standby state (STANDBY mode) from the idling state (IDLE mode), when the pod 110 having the wafer 200 stored therein, is placed on the load port 114. The standby state (STANDBY mode) is an apparatus state impossible to allow a person to step into the substrate processing apparatus 100, and also a state possible to execute the recipe. When the indication of execution (indication of start) of the substrate processing recipe is inputted from the group management device 500 or the touch panel 7 in the standby state (STANDBY mode), the shift indicating part 2 controls the apparatus state of the substrate processing apparatus 100 so as to be shifted from the standby state (STANDBY mode) to the running state (RUN mode) of the substrate processing recipe. Specifically, when the pod 110 is placed on the load port 114 by the in-step carrier device (not shown), the substrate detection sensor 140 detects the pod 110, and the event detection part 3 notifies the shift indicating part 2 of the placement of the pod 110 on the load port 114. Further, when the indication of execution (indication of start) of the substrate processing recipe is inputted from the group management device 500 or the touch panel 7, the event detection part 3 notifies the shift indicating part 2 of the indication of execution. Then, the shift indicating part 2 controls the apparatus state of the substrate processing apparatus 100 so as to be shifted from the standby state (STANDBY mode) to the running state (RUN mode) of the substrate processing recipe.

Further, when the shift indicating part 2 controls the apparatus state to be set in the "idling state", after elapse of time in this "idling state" in which the pod 110 with the wafer 200 stored therein, is not placed on the load port 114, or the indication of execution of the substrate processing recipe is not inputted from the group management device 500 or the touch panel 7, or the event detection part 3 does not notify the shift indicating part 2 of the generation of a prescribed event (shift inhibited event) detected by the event detection part 3, the shift indicating part 2 controls the apparatus state of the substrate processing apparatus 100 so as to be automatically shifted from the idling state (IDLE mode) to the standby state (STANDBY mode). Thereafter, the shift indicating part 2 controls the apparatus state of the substrate processing apparatus 100 so as to be automatically shifted from the standby state (STANDBY mode) to the running state (RUN mode) for executing the purge cleaning processing recipe, being a maintenance recipe.

The running state (RUN mode) is a state to execute each kind of recipe defined by a recipe file. In the running state (RUN mode), based on the description of the recipe file, the substrate processing apparatus controller 240 transmits a prescribed set value (control value) at a prescribed timing, to the sub-controllers such as external combustion controller 10, transfer controller 11, temperature controller 12, pressure controller 13, and supply controller 14.

Note that during the running state (RUN mode), under the control of the shift indicating part 2, start of the substrate processing recipe is waited without halting a progress of the purge cleaning processing recipe, even if the indication of execution of the substrate processing recipe is received from the group management device 500 or the touch panel 7, and after end of the purge cleaning processing step, the substrate processing step is started.

When the execution of the substrate processing recipe or the purge cleaning processing recipe is completed, the shift indicating part 2 controls the apparatus state of the substrate processing apparatus 100 so as to be shifted from the running state (RUN mode) to the end state (END mode). The end state (END mode) is a state in which the execution of the recipe is ended. Note that the end state (END mode) includes two states, such as a normal end state in which the recipe is normally ended, and an abnormal end state in which the recipe is abnormally ended due to some trouble.

In addition, in the standby state (STANDBY mode), for example, by pressing operation of an IDLE button on an operation screen displayed on the touch panel 7, forcible shift is possible from the standby state (STANDBY mode) to the idling state (IDLE mode). This case is effective when the pod 110 (wafer 200) is waited due to temporary halt of a production line for certain reasons. Also, for example, by pressing operation of a RESET button on the operation screen in any one of the idling state (IDLE mode), standby state (STANDBY mode), running state (RUN mode), and end state (END mode), forcible shift to the initial state (RESET mode) is possible. This case is effective when the substrate processing apparatus 100 is returned to the initial state (RESET mode), due to some trouble that occurs to the apparatus.

(7) Operation of a State Shift of the Substrate Processing Apparatus

Subsequently, operation of a state shift of the substrate processing apparatus 100 will be described, with reference to FIG. 7 and FIG. 8.

(Initial State (RESET Mode))

As shown in FIG. 7, when the power of the substrate processing apparatus 100 is turned-on (POWER On), the shift indicating part 2 sets the state of each part of the substrate processing apparatus 100 in the initial state (RESET mode).

(Idling State (IDLE Mode))

When the state of each part of the substrate processing apparatus 100 is set in the initial state (RESET mode), the shift indicating part 2 controls the state of the substrate processing apparatus 100 so as to be shifted to the idling state (IDLE mode) possible to receive the indication of execution of the substrate processing recipe or the purge cleaning processing recipe, being the state possible to allow the person to step into the substrate processing apparatus 100.

When the apparatus state of the substrate processing apparatus 100 is set in the idling state (IDEL mode), the shift indicating part 2 controls the apparatus state to be set in the "idle mode" in which the generation of a prescribed event is waited, and starts measurement of the elapsed time by utilizing the clock function of the substrate processing apparatus controller 240.

Then, when the state is set in the "idling state", the shift indicating part 2 is notified of the generation of a prescribed event (shift inhibited event) when it is detected by the event detection part 3. Then, the shift indicating part 2 controls the apparatus state of the substrate processing apparatus 100 so as to be inhibited from shifting to the standby state (STANDBY mode) and stay in the idling state (IDLE mode).

Further, when the apparatus state is set in the aforementioned "idling state", the pod 110 is placed on the load port 114, and the indication of execution of the substrate processing recipe is inputted from the group management device 500 or the touch panel 7, the shift indicating part 2 controls the apparatus state of the substrate processing apparatus 100 so as to be shifted from the idling state (IDLE mode) to the standby state (STANDBY mode). Thereafter, when the substrate processing apparatus controller 240 selects (prepares) a prescribed substrate processing recipe, the shift indicating part 2 controls the apparatus state of the substrate processing apparatus 100 so as to be shifted from the standby state (STANDBY mode) to the running state (RUN mode).

Further, after prescribed time passes during the aforementioned "idling state" (IDLE mode) in such a situation that the pod 110 with the wafer 200 stored therein, is not placed on the load port 114, or the indication of execution of the substrate processing recipe is not inputted from the group management device 500 or the touch panel 7, or the event detection part 3 does not notify the shift indicating part 2 of the event of the generation of a prescribed event (shift inhibited event) detected by the event detection part 3, the shift indicating part 2 controls the apparatus state of the substrate processing apparatus 100 so as to be automatically shifted from the idling state (IDLE mode) to the standby state (STANDBY mode). Thereafter, when the substrate processing apparatus controller 240 selects (prepares) a prescribed cleaning recipe, the shift indicating part 2 controls the apparatus state of the substrate processing apparatus 100 so as to be automatically shifted from the standby state (STANDBY mode) to the running state (RUN mode).

(Running State (RUN Mode))

In the running state (RUN mode), when the pod 110 is placed on the load port 114 (when the wafer 200 is charged into the substrate processing apparatus 100), the substrate processing apparatus controller 240 executes the substrate processing recipe, and transmits a prescribed set value (control value) at a prescribed timing, to the sub-controllers such as external combustion controller 10, transfer controller 11, temperature controller 12, pressure controller 13, and gas supply controller 14 based on the description of the recipe file. Thus, when the indication of execution of the substrate processing recipe is inputted from the group management device 500 or the touch panel 7, the substrate processing apparatus controller 240 executes the substrate processing recipe when the apparatus state is set in the running state (RUN mode). Further, when the apparatus state is shifted to the running state (RUN mode) without charging the wafer 200 into the substrate processing apparatus 100, the substrate processing apparatus controller 240 executes the purge cleaning processing recipe as the maintenance recipe, when the apparatus state is set in this running state (RUN mode).

(End State (END Mode))

When the execution of the substrate processing recipe or the purge cleaning processing recipe is completed, the shift indicating part 2 controls the apparatus state of the substrate processing apparatus 100 so as to be shifted from the running state (RUN mode) to the end state (END mode).

Then, when the apparatus state of the substrate processing apparatus 100 is set in the end state (END mode), the shift indicating part 2 controls the apparatus state of the substrate processing apparatus 100 so as to be shifted from the end state (END mode) to the idling state (IDLE mode), and thereafter, as shown in FIG. 8, the aforementioned operation is repeated.

(8) Effects of this Embodiment

According to this embodiment, one or a plurality of effects shown below are exhibited.

(a) According to this embodiment, when the notification is received regarding the event of the generation of the prescribed event (shift inhibited event) detected by the event detection part 3 in the idling state (IDLE mode), the apparatus state of the substrate processing apparatus 100 is controlled so as to be inhibited from shifting to the standby state (STANDBY mode) possible to execute the recipe, being the apparatus state impossible to allow the person to step into the substrate processing apparatus 100, from the idling state (IDLE mode) possible to receive the indication of execution of the recipe, being the apparatus state possible to allow the person to step into the substrate processing apparatus 100. Thus, even if the maintenance of the substrate processing apparatus 100 is performed by the maintenance engineer in the idling state (IDLE mode), automatic shift of the apparatus state of the substrate processing apparatus 100 from the idling state (IDLE mode) to the standby state (STANDBY mode) can be suppressed.

(b) According to this embodiment, after prescribed time passes during in the idling state (IDLE mode) in such a situation that the pod 110 is not placed on the load port 114, or the indication of execution of the substrate processing recipe is not inputted from the group management device 500 or the touch panel 7, or the event detection part 3 does not notify the shift indicating part 2 of the event of the generation of the prescribed event (shift inhibiting event) detected by the event detection part 3, the shift indicating part 2 controls the apparatus state of the substrate processing apparatus 100 so as to automatically shifted from the idling state (IDLE mode) to the standby state (STANDBY mode). Thereafter, the shift indicating part 2 controls the apparatus state of the substrate processing apparatus 100 so as to be shifted to the running state (RUN mode) for executing the purge cleaning processing recipe. Thus, the purge cleaning processing step can be automatically performed in a vacant time of the substrate processing step, and therefore the inside of the processing chamber 201 can be maintained always in a clean state, and productivity can be improved.

(c) According to this embodiment, in the idling state (IDLE mode), when the casing 111, sub-casing 119, and front maintenance door 104, etc, are opened, the shift of the apparatus state of the substrate processing apparatus 100 from the idling state (IDLE mode) to the standby state (STANDBY mode) is inhibited. Thus, when the maintenance engineer performs maintenance of the substrate processing apparatus 100 in the idling state (IDLE mode), the shift from the idling state (IDLE mode) to the standby state (STANDBY mode) of the apparatus state of the substrate processing apparatus 100 can be inhibited unless there is a command from the maintenance engineer.

(d) According to this embodiment, when the connection between the substrate processing apparatus controller 240 and the substrate transfer system is set to be local (LOCAL) in the idling state (IDLE mode), the shift of the apparatus state of the substrate processing apparatus 100 is inhibited from the idling state (IDLE mode) to the standby state (STANDBY mode). Thus, when the maintenance of the substrate processing apparatus 100 is performed by the maintenance engineer in the idling state (IDLE mode), the shift of the apparatus state of the substrate processing apparatus 100 from the idling state (IDLE mode) to the standby state (STANDBY mode) can be inhibited even if a prescribed time is elapsed during operation of the substrate transfer system in the connection of local (LOCAL).

(e) According to this embodiment, when the connection between the substrate processing apparatus 100 and the group management device 500 is off line (OFF LINE) in the idling state (IDLE mode), the shift of the apparatus state of the substrate processing apparatus 100 is inhibited from the idling state (IDLE mode) to the standby state (STANDBY mode). Thus, when the maintenance of the substrate processing apparatus 100 is performed by the maintenance engineer in the idling state (IDLE mode), the automatic shift of the substrate processing apparatus 100 from the idling state (IDLE mode) to the standby state (STANDBY mode) can be inhibited, even if the connection between the substrate processing apparatus 100 and the group management device 500 is off line (OFF LINE).

(f) According to this embodiment, during the running state (RUN mode), under the control of the shift indicating part 2, start of the substrate processing recipe is waited without halting a progress of the purge cleaning processing recipe, even if the indication of execution of the substrate processing recipe is received from the group management device 500 or the touch panel 7, and after end of the purge cleaning processing step, the substrate processing step is started. Thus, the purge cleaning processing recipe can be surely executed to a final point without ending this recipe in the middle. Therefore, the inside of the processing chamber 201 can be maintained always in a clean state.

Other Embodiment of the Present Invention

Note that according to this embodiment, during the "idling state", after elapse of a prescribed time, the maintenance recipe (purge cleaning processing recipe) is automatically executed. However, the present invention is not limited to this embodiment, and even if the "idling state" is continued for a prescribed time, the shift of the apparatus state is carried out to the standby state (STANDBY mode), and the indication of execution of the maintenance recipe may be waited. Further, in order to execute the maintenance recipe, the apparatus state may be shifted to the standby state (STANDBY mode) manually (for example, by operating the touch panel 7 by the maintenance engineer). Further, a semiconductor manufacturing device is shown as an example of the substrate processing apparatus. However, the present invention is not limited to the semiconductor manufacturing device, and an apparatus that processes a glass substrate such as an LCD apparatus may be used. Further, specific content of the substrate processing is not particularly limited, and not only a film formation processing but also annealing, oxidizing, nitriding, and diffusing processing, etc, may also be acceptable. Further, the film formation processing may be a processing of forming, for example, CVD, PVD, an oxide film, and a nitride film, and also a processing of forming a film containing metal.

As described above, the embodiments of the present invention have been specifically described. However, the present invention is not limited to the above-described embodiments, and can be variously modified in a range not departing from the scope of the gist.

Preferred Aspects of the Present Invention

Preferred aspects of the present invention will be additionally described hereafter.

According to an aspect of the present invention, a substrate processing apparatus is provided, which applies specified processing to substrates by executing a recipe with a processing condition and a processing procedure defined, comprising:

a controller that controls operation of each part of the substrate processing apparatus;

the controller comprising:

a shift indicating part that controls an apparatus state of the substrate processing apparatus so as to be shifted from an idling state possible to receive an indication of execution of the recipe, being an apparatus state possible to step into the substrate processing apparatus, to a standby state possible to execute the recipe, being an apparatus state impossible to step into the substrate processing apparatus; and an event detection part that detects a prescribed event for inhibiting a shift from the idling state to the standby state and notifies the shift indicating part of this event, wherein when the shift indicating part is notified of the event detected by the event detection part, the shift from the idling state to the standby state is inhibited.

Preferably, the recipe is a substrate processing recipe for processing the substrates.

Further preferably, the substrate processing apparatus comprises a processing chamber for containing the substrates, wherein the recipe is a purge cleaning processing recipe for applying purge cleaning processing to an inside of the processing chamber by supplying purge gas into the processing chamber.

Further preferably, the substrate processing apparatus comprises:

a step-in mechanism into the substrate processing apparatus; and a step-in sensor for notifying the event detection part of an open state of the step-in mechanism, wherein when the event detection part receives from the step-in sensor the notification regarding the open state, detects the generation of the prescribed event and notifies the shift indicating part of this event.

Further preferably, the substrate processing apparatus comprises:

a substrate transfer system that carries the substrates into/outside of the processing chamber;

an operation part that received input of an operation command to the substrate transfer system and notifies an event detection part of an input of the operation command, wherein when the event detection part receives a notification regarding the input of the operation command from the operation part to the substrate transfer system, detects the prescribed event and notifies the shift indicating part of this event.

Further preferably, the substrate processing apparatus comprises:

a substrate processing system that applies processing to the substrates; and an operation part that receives an input of an operation command to the substrate processing system and notifies the event detection part of the input of the operation command, wherein when the event detection part receives a notification regarding the input of the operation command from the operation part to the substrate processing system, detects the prescribed event and notifies the shift indicating part of this event.

Further preferably, the substrate processing apparatus comprises:

a communication controller connected to a group management device, for controlling a communication with the group management device and also notifying an event detection part of a communication state with the group management device which is set to be off line, wherein when the event detection part receives the notification regarding the offline of the communication with the group management device, detects the prescribed event and notifies the shift indicating part of this event.

Further preferably, the substrate processing apparatus comprises:

a placement part on which a substrate container for containing the substrates is placed; and a substrate detection sensor that notifies the event detection part of the placement of the substrate container on the placement part, wherein the shift indicating part controls an apparatus state of the substrate processing apparatus so as to be shifted to the idling state, and thereafter inhibits the shift of the apparatus state of the substrate processing apparatus from the idling state to the standby state when a notification regarding the generation of a prescribed event detected by the event detection part, is received from the event detection part within a prescribed time, then controls the apparatus state of the substrate processing apparatus so as to be shifted from the idling state to the standby state when a notification regarding a placement of the substrate container is received from the substrate detection sensor, without receiving the notification regarding the generation of the event detected by the event detection part from the event detection part within a prescribed time, and waits for an indication of execution of the substrate processing recipe, and controls the apparatus state of the substrate processing apparatus so as to be shifted from the idling state to the standby state when the notification regarding the generation of the event detected by the event detection part, is received from the event detection part within the prescribed time, and executes the purge cleaning processing recipe.

Further preferably, the substrate processing apparatus comprises:

a heating mechanism that heats the substrates; and a temperature controller that adjusts the temperature of the substrates to a prescribed temperature by controlling a temperature of the heating mechanism, and notifies the event detection part of an abnormal heating mechanism if it is abnormal, wherein when a notification regarding the abnormal heating mechanism is received from the temperature controller in the idling state, the event detection part detects the prescribed event and notifies the shift indicating part of this event.

Further preferably, the substrate processing apparatus comprises:

a gas exhaust mechanism that exhausts an atmosphere in the processing chamber; and a pressure controller that adjusts a pressure in the processing chamber by controlling the gas exhaust mechanism and notifies the event detection part of the abnormal gas exhaust mechanism if it is detected to be abnormal wherein when the event detection part receives a notification regarding the abnormal gas exhaust mechanism from the pressure controller in the idling state, the event detection part detects the prescribed event and notifies the shift indicating part of this event.

Further preferably, the substrate processing apparatus comprises:

a placement part on which a substrate container for containing the substrates is placed:

a substrate container carrier that carries the substrate container placed on the placement part, to a prescribed position of the substrate processing apparatus; and a transfer controller that controls the substrate container carrier and notifies the event detection part of an abnormal state of the substrate container carrier if it is abnormal, wherein when a notification regarding the abnormal state of the substrate container carrier is received from the transfer controller in the idling state, the event detection part detects the prescribed event and notifies the shift indicating part of this event.

Further preferably, the substrate processing apparatus comprises:

a substrate carrier that caries the substrates to inside/outside of the substrate container carrier; and a transfer controller that controls the substrate carrier and notifies the event detection part of an abnormal state of the substrate carrier if it is abnormal, wherein when the event detection part receives a notification regarding the abnormal state of the substrate carrier from the transfer controller in the idling state, the event detection part detects the prescribed event and notifies the shift indicating part of this event.

Further preferably, the substrate processing apparatus comprises:

a substrate holding tool that holds the substrates in the processing chamber;

a substrate holding tool elevating mechanism that elevates the substrate holding tool in the processing chamber; and a transfer controller that controls the substrate holding tool elevating mechanism and notifies the event detection part of an abnormal state of the substrate holding tool elevating mechanism if it is abnormal, wherein when the event detection part receives a notification regarding the abnormal state of the substrate holding tool elevating mechanism from the transfer controller in the idling state, the event detection part detects the prescribed event and notifies the shift indicating part of this event.

Further preferably, the substrate processing apparatus comprises:

a rotation mechanism that rotates the substrate holding tool in the processing chamber; and a rotation mechanism controller that controls the rotation mechanism and notifies the event detection part of an abnormal state of the rotation mechanism if it is abnormal, wherein when the event detection part receives a notification regarding the abnormal state of the rotation mechanism from the rotation mechanism controller in the idling state, the event detection part detects the prescribed event and notifies the shift indicating part of this event.

Further preferably, the controller is constituted as a computer having a central processing unit, a memory, a storage part, a display part, an input part, and a communication part, wherein the storage part stores a shift indicating program and an event detection program, the shift indicating program is read from the storage part to the memory and executed by the central processing unit, to thereby realize the shift indicating part on the controller, and the event detection program is read from the storage part to the memory and executed by the central processing unit, to thereby realize the event detection part on the controller.

Preferably, under the control of the shift indicating part 2, start of the substrate processing recipe is waited without halting a progress of the purge cleaning processing recipe, even if an indication of execution of the substrate processing recipe is received during executing the purge cleaning processing recipe, and after end of the purge cleaning processing recipe, the substrate processing recipe is started.

What is claimed is:

1. A control method of a substrate processing apparatus, comprising the steps of:

shifting an apparatus state from an initial state immediately after turning-on a power of the substrate processing apparatus, to an idling state possible to receive an indication of execution of a specified recipe, the idling state being an apparatus state possible to step into the substrate processing apparatus;

shifting the apparatus state from the idling state to a standby state possible to execute the specified recipe, the standby state being an apparatus state impossible to step into the substrate processing apparatus, after elapse of a prescribed time from shifting the apparatus state to the idling state; and shifting the apparatus state from the standby state to a running state to execute a specified processing in accordance with a processing condition and a processing procedure defined in the specified recipe, wherein when a prescribed event for inhibiting a shift from the idling state to the standby state is generated in the prescribed time in the idling state, the shift from the idling state to the standby state is inhibited, the specified recipe is not executed, and the apparatus state remains in the idling state, and when the prescribed event is not generated in the prescribed time, if a substrate is not charged into the substrate processing apparatus, the apparatus state is shifted to the standby state from the idling state, and the apparatus state is shifted to the running state from the standby state; wherein a prescribed purge cleaning process recipe is executed, as the specified recipe, in the running state, and if the substrate is charged into the substrate processing apparatus, the apparatus state is shifted to the standby state from the idling state, and when an execution command of a substrate processing recipe is inputted, as the specified recipe, the apparatus state is shifted to the running state from the standby state, and the substrate processing recipe is executed wherein the shifting between the initial state, the idling state, the standby state, and the running state is performed by a shift indicating part of a controller of the substrate processing apparatus.

2. A manufacturing method of a semiconductor device, comprising the steps of:

shifting an apparatus state from an initial state immediately after turning-on a power of a substrate processing apparatus, to an idling state possible to receive an indication of execution of a specified recipe, the idling state being an apparatus state possible to step into the substrate processing apparatus;

shifting the apparatus state from the idling state to a standby state possible to execute the specified recipe, the standby state being an apparatus state impossible to step into the substrate processing apparatus, after elapse of a prescribed time from shifting the apparatus state to the idling state; and shifting the apparatus state from the standby state to a running state to execute a specified processing in accordance with a processing condition and a processing procedure defined in the specified recipe, wherein when a prescribed event for inhibiting a shift from the idling state to the standby state is generated in the prescribed time in the idling state, a shift from the idling state to the standby state is inhibited, the specified recipe is not executed, and the apparatus state remains in the idling state, and when the prescribed event is not generated in the prescribed time, if a substrate is not charged into the substrate processing apparatus, the apparatus state is shifted to the standby state from the idling state, and the apparatus state is shifted to the running state from the standby state; wherein a prescribed purge cleaning process recipe is executed, as the specified recipe, in the running state, and if the substrate is charged into the substrate processing apparatus, the apparatus state is shifted to the standby state from the idling state, and when an execution command of a substrate processing recipe is inputted, as the specified recipe, the apparatus state is shifted to the running state from the standby state, and the substrate processing recipe is executed;

wherein the shifting between the initial state, the idling state, the standby state, and the running state is performed by a shift indicating part of a controller of the substrate processing apparatus.

3. An apparatus state shifting method, comprising the steps of:

shifting an apparatus state from an initial state immediately after turning-on a power of an apparatus, to an idling state possible to receive an indication of execution of a specified recipe, the idling state being an apparatus state possible to step into the apparatus;

shifting the apparatus state from the idling state to a standby state possible to execute the specified recipe, the standby state being an apparatus state impossible to step into the apparatus, after elapse of a prescribed time from shifting the apparatus state to the idling state;

shifting the apparatus state from the standby state to a running state to execute a specified processing in accordance with a processing condition and a processing procedure defined in the specified recipe; and when the specified processing is ended, shifting the apparatus state from an end state to the idling state, wherein when a prescribed event for inhibiting a shift from the idling state to the standby state is generated in the prescribed time in the idling state, the shift from the idling state to the standby state is inhibited, and the apparatus remains in the idling state, and when the prescribed event is not generated in the prescribed time, if a substrate is not charged into the substrate processing apparatus, the apparatus state is shifted to the standby state from the idling state, and the apparatus state is shifted to the running state from the standby state, wherein a prescribed purge cleaning process recipe is executed, as the specified recipe, in the running state, and if the substrate is charged into the substrate processing apparatus, the apparatus state is shifted to the standby state from the idling state, and when an execution command of a substrate processing recipe is inputted, as the specified recipe, the apparatus state is shifted to the running state from the standby state, and the substrate processing recipe is executed;

wherein the shifting between the initial state, the idling state, the standby state, and the running state is performed by a shift indicating part of a controller of the substrate processing apparatus.

* * * * *